US012677626B2

(12) United States Patent
Aderhold et al.

(10) Patent No.: US 12,677,626 B2
(45) Date of Patent: Jul. 7, 2026

(54) LOW TEMPERATURE MEASUREMENT OF SEMICONDUCTOR SUBSTRATES

(71) Applicant: Applied Materials, Inc., Santa Clara, CA (US)

(72) Inventors: Wolfgang R. Aderhold, Cupertino, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 363 days.

(21) Appl. No.: 18/492,205

(22) Filed: Oct. 23, 2023

(65) Prior Publication Data

US 2024/0145274 A1    May 2, 2024

Related U.S. Application Data

(60) Provisional application No. 63/381,407, filed on Oct. 28, 2022.

(51) Int. Cl.
H10P 72/00 (2026.01)

(52) U.S. Cl.
CPC ...... H10P 72/0602 (2026.01); H10P 72/0604 (2026.01)

(58) Field of Classification Search
CPC ............. H10P 72/0602; H10P 72/0604; H10P 72/0436; G01K 1/02
See application file for complete search history.

(56) References Cited

U.S. PATENT DOCUMENTS

| | | | | |
|---|---|---|---|---|
| 10,281,335 B2 * | 5/2019 | Howells | ................ | G01J 5/0821 |
| 2006/0086713 A1 | 4/2006 | Hunter et al. | | |
| 2007/0238202 A1 | 10/2007 | Ranish et al. | | |
| 2010/0054720 A1 * | 3/2010 | Hunter | ................ | H10P 72/0602 |
| | | | | 392/416 |
| 2020/0064198 A1 * | 2/2020 | Bremensdorfer | .... | B23K 26/032 |

FOREIGN PATENT DOCUMENTS

| | | |
|---|---|---|
| KR | 20150107090 A | 9/2015 |
| WO | 2018217408 A1 | 11/2018 |

OTHER PUBLICATIONS

Internationsl Search Report/ Written Opinion issued to PCT/US2023/035714 on February 5. 2024.

* cited by examiner

*Primary Examiner* — John E Breene
*Assistant Examiner* — Manuel Salvador Castellon, Jr.
(74) *Attorney, Agent, or Firm* — Patterson + Sheridan, LLP

(57) ABSTRACT

Examples described herein generally relate to apparatus and methods for rapid thermal processing (RTP) of a substrate. The present disclosure discloses pulsed radiation sources used to measure a broad range of low to high temperatures in the RTP chamber, each at a discrete wavelength, are used at a low temperature regime before using one laser at a discrete wavelength for higher temperatures. In another example, a single laser is used for both the low temperature regime and higher temperatures. These methods are useful for detection of a broad range of low to high temperatures in the RTP chamber with varying substrate types.

20 Claims, 7 Drawing Sheets

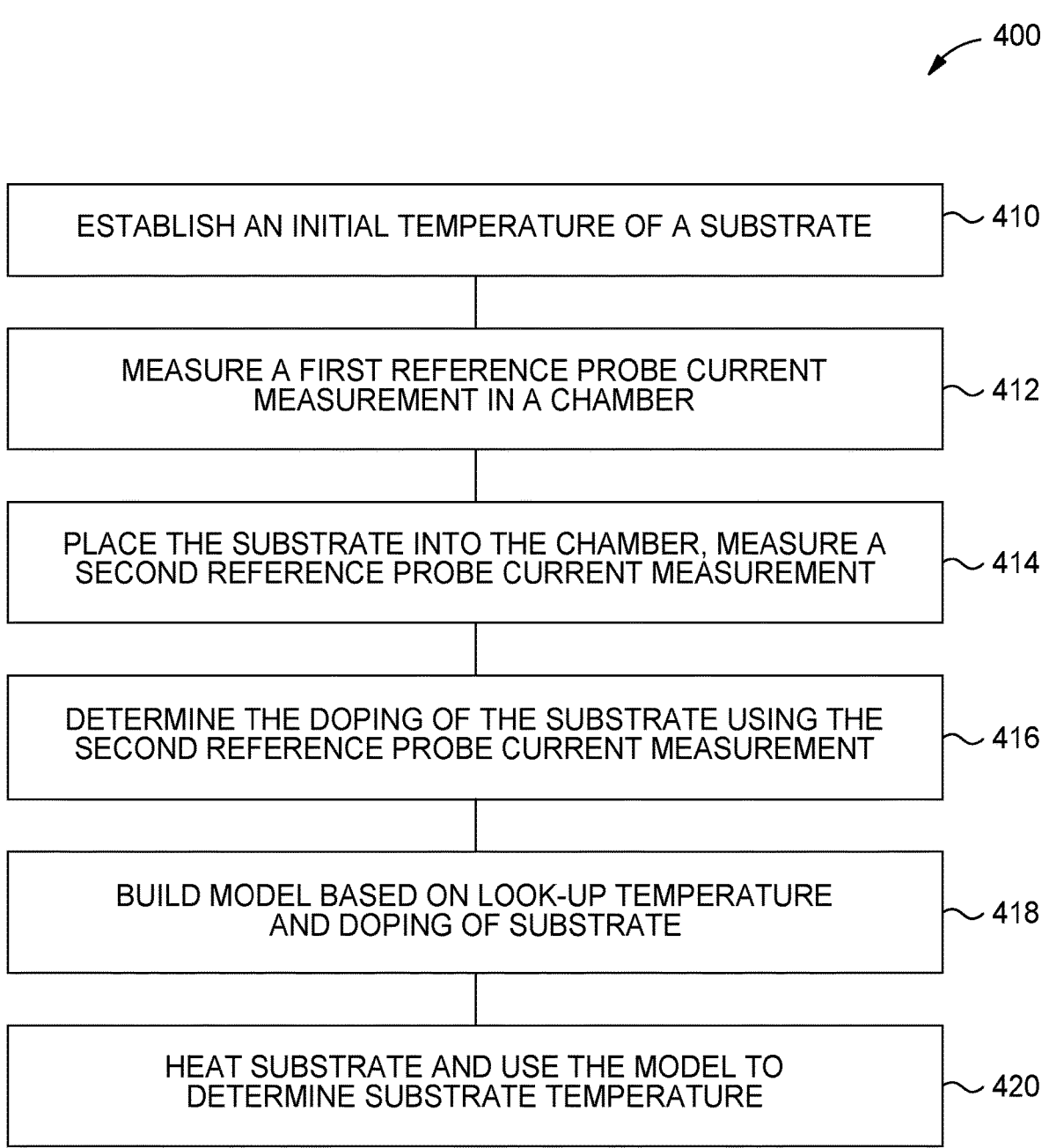

400

ESTABLISH AN INITIAL TEMPERATURE OF A SUBSTRATE ~410

MEASURE A FIRST REFERENCE PROBE CURRENT MEASUREMENT IN A CHAMBER ~412

PLACE THE SUBSTRATE INTO THE CHAMBER, MEASURE A SECOND REFERENCE PROBE CURRENT MEASUREMENT ~414

DETERMINE THE DOPING OF THE SUBSTRATE USING THE SECOND REFERENCE PROBE CURRENT MEASUREMENT ~416

BUILD MODEL BASED ON LOOK-UP TEMPERATURE AND DOPING OF SUBSTRATE ~418

HEAT SUBSTRATE AND USE THE MODEL TO DETERMINE SUBSTRATE TEMPERATURE ~420

FIG. 4

LOW TEMPERATURE MEASUREMENT OF SEMICONDUCTOR SUBSTRATES

CROSS-REFERENCE TO RELATED APPLICATIONS

This application claims benefit of and priority to U.S. patent application Ser. No. 63/381,407, entitled "LOW TEMPERATURE MEASUREMENT OF SEMICONDUCTOR SUBSTRATES," filed Oct. 28, 2022, and assigned to the assignee hereof, the contents of which is hereby incorporated by reference in its entirety.

BACKGROUND

Field

Embodiments described herein relate generally to apparatus and methods of extended temperature pyrometry, which can be used in the processing of semiconductor wafers. More specifically, the apparatus and methods described herein relate to rapid thermal processing (RTP) of semiconductor substrates and extended temperature, including low temperature, pyrometry techniques used in RTP.

Description of the Related Art

Rapid thermal processing (RTP) is a term applied to several types of thermal processes including annealing, dopant activation, oxidation, and nitridation which are typically performed at relatively high temperatures above about 1000° C. RTP can be further applied to etching and chemical vapor deposition in the presence of precursor or etching gases. These processes are conventionally performed in an RTP chamber at temperatures of between 500° C. and 800° C. RTP typically depends upon an array of high-intensity incandescent lamps fit into a lamp head and directed at the substrate being processed. The lamps can be turned on and off quickly and a substantial fraction of their radiation can be directed to the substrate. As a result, the substrate can be quickly heated to a desired thermal state.

Transmission pyrometry is a common mode of assessing the thermal state of the substrate. Thermal processing chambers commonly expose a substrate to intense, non-coherent or coherent radiation to raise the temperature of the substrate, either of the whole substrate or a part or surface area of the substrate. The radiation used to heat the substrate can create a strong background radiation environment in the chamber.

Radiation is used in transmission pyrometry applications to assess the thermal state of the substrate because the radiation having different wavelengths can be differentiated from the background radiation in the chamber. Lasers are typically used because they afford the opportunity to select a particular wavelength best suited to the substrate. Lasers produce coherent radiation that, when transmitted through a substrate, can indicate a thermal state of the substrate, which may be registered as a temperature. The transmitted radiation may be detected by a pyrometer, compared to the source radiation, and the result is correlated to infer the substrate thermal state.

Current pyrometers use two detectors to sum radiation intensity of two wavebands emitted by one or more lasers before relating the quotient of the two intensities to temperature using a temperature look-up table. In ideal cases, such as blackbodies, the emissivity cancels out. In practice, the emissivity is provided by a manufacturer and entered by an operator or assumed to be in unity. However, emissivity is often unknown or changing. Further, pyrometers that rely on ratios are susceptible to noise as the differences in intensity at the two wavelengths are often relatively small.

However, thermal noise, or electrical fluctuations arising from random thermal motion of electrons, from chamber thermal sources such as the illuminated lamps and substrate emissions can reduce accuracy and precision of conventional transmission pyrometry methods using high-resistivity substrates. Additionally, current transmission pyrometry apparatus and methods describe solutions to thermal noise but these solutions are limited to silicon substrates and often require multiple lasers at multiple wavelengths to be used for the duration of the method.

Therefore, there is a need for improved apparatuses and methods for reliable transmission pyrometric measurements of low to high temperatures operable in a wider range of semiconductor substrates.

SUMMARY

Examples described herein generally relate to apparatus and methods for rapid thermal processing (RTP) of a substrate. The present disclosure discloses pulsed radiation sources used to measure a broad range of low to high temperatures in the RTP chamber, each at a discrete wavelength, and at a low temperature regime before using a single laser at a discrete wavelength for higher temperatures. In another example, a single laser is used for both the low temperature regime and higher temperatures.

TO BE COMPLETED AFTER FINAL APPROVAL OF THE CLAIMS.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

FIG. 4 illustrates a flow diagram of a single wavelength temperature measurement method according to one example of the present disclosure.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Examples described herein generally relate to apparatus and methods for rapid thermal processing (RTP) of a substrate. The present disclosure discloses radiation sources used to measure a broad range of low to high temperatures in the RTP chamber. In one example, two or more lasers, each at a discrete wavelength, are used at a low temperature regime before using a single laser at a discrete wavelength for higher temperatures. In another example, a single laser is used for both the low temperature regime and higher temperatures.

Figure 1:
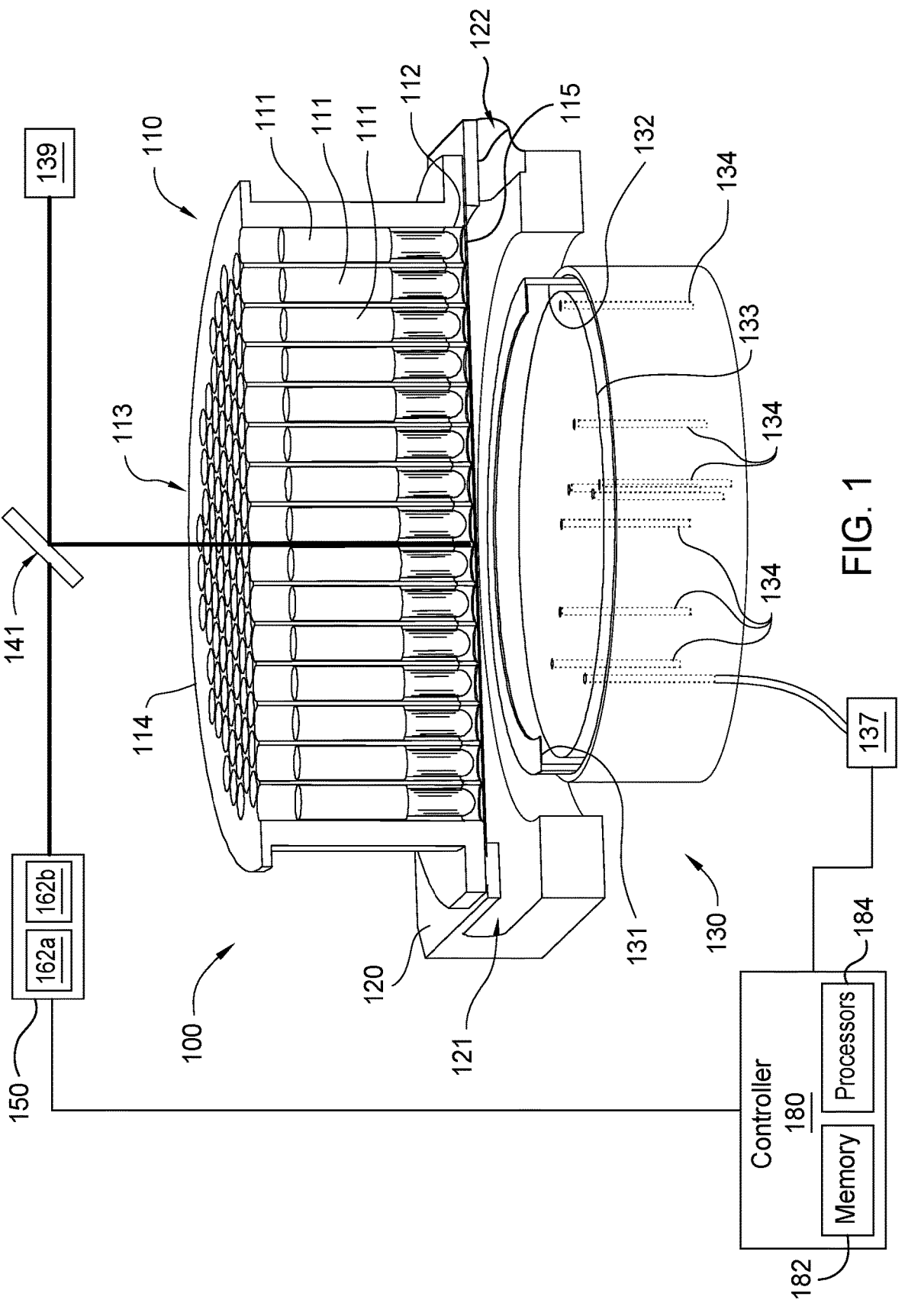
FIG. 1 is a partial schematic diagram of a rapid thermal processing (RTP) chamber including two or more lasers according to one exemplary embodiment of the present disclosure.

FIG. 1 is a partial schematic diagram of a rapid thermal processing (RTP) chamber 100 according to examples of the present disclosure. The chamber 100 generally includes a lamp assembly 110, a chamber body 120, and a substrate support assembly 130. For clarity, the chamber 100 has been cross-sectioned, and only the upper portion of chamber body 120 is illustrated in FIG. 1.

The lamp assembly 110 includes a plurality of lamps 111, each of which is positioned inside a reflective tube 112. The lamps 111 may be incandescent lamps, such as tungsten-halogen, or other high output lamps, such as discharge lamps. Together, the reflective tubes 112 form a honeycomb array 113 inside a water-cooled housing 114. In one example, a very thin window 115 forms the bottom surface of lamp assembly 110, separating lamp assembly 110 from the vacuum usually present in the chamber 100. In another example, the window 115 is a separate element. The window 115 is generally made of or coated by any material resistant to the processing environment and transmissive to the selected radiation. Lamp assembly 110 is attached to the upper surface of chamber body 120 in a vacuum-tight manner.

The chamber body 120 includes walls and a floor of the chamber 100. A substrate opening 121 and an exhaust opening 122 are formed through the walls of the chamber body 120. Substrates are delivered into and removed from the chamber 100 through substrate opening 121, and a vacuum pump (not shown) evacuates the chamber 100 through the exhaust opening 122. Slit or gate valves (not shown) may be used to seal the substrate opening 121 and the exhaust opening 122 when necessary.

The substrate support assembly 130, which defines a processing plane, is contained inside the chamber body 120 and includes an edge support 131, a rotatable member 132 disposed in contact with the edge support 131, a reflector plate 133, and an array of photo probes 134 (e.g., optical fibers). The edge support 131 rests on rotatable member 132. The rotatable member 132 is generally any suitable size and shape, and is made of a heat resistant material. During substrate processing, the edge support 131 supports a substrate (not shown for clarity) a distance below the window 115. The rotatable member 132 rotates between about 50 rotations per minute (rpm) and about 300 rpm during substrate processing to maximize substrate temperature uniformity during processing by minimizing the effect of thermal asymmetries in the chamber 100 on the substrate. The reflector plate 133 is positioned a distance beneath the substrate. The photo probes 134 penetrate partly or completely through the reflector plate 133 and are directed toward a backside of the substrate during thermal processing. The photo probes 134 transmit radiant energy received from the substrate to one or more detectors 137, which may be pyrometers, for determining substrate temperature. Only one detector 137 is shown for clarity, but multiple detectors 137 may be used, each coupled to one or more of the photo probes. The one or more detectors 137 may detect radiation emitted by the substrate or radiation transmitted by the substrate.

Each of the one or more detectors 137 can be any suitable photodetector. In one example, a detector 137 includes a filter that provides a spectral response sensitive to the wavelength of the absorption gap at the substrate temperatures between about 100° C. and about 350° C. The particular photodetector used therein may be a silicon photodetector for temperatures below about 350° C., since the absorption gap of silicon varies from about 1,000 nm to about 1,200 nm for temperatures from room temperature to 350° C. A silicon photodetector may be insensitive to radiation having a wavelength greater than about 1,100 nm. For temperatures higher than about 350° C., the absorption edge may be beyond the detection limits of the silicon photodetector, so any further increases in the absorption edge wavelength may not be readily detected. Similarly, a gallium arsenide (GaAs) photodetector may be insensitive to radiation having a wavelength greater than 860 nm.

The one or more detectors 137 are coupled to a controller 180 which includes one or more processors 184 and a memory 182. The controller 180 is configured to monitor and control the thermal processing operations using the one or more processors 184 and the memory 182.

The controller 180 generally includes the one or more processors 184, memory 182, and support circuits. The one or more processors 184 may include a central processing unit (CPU) and may be one of any form of a general purpose processor that can be used in an industrial setting. The memory 182, or non-transitory computer-readable medium, is accessible by the one or more processors 184 and may be one or more of memory such as random access memory (RAM), read only memory (ROM), floppy disk, hard disk, or any other form of digital storage, local or remote. The support circuits are coupled to the one or more processors 184 and may comprise cache, clock circuits, input/output subsystems, power supplies, and the like. The various methods disclosed herein may generally be implemented under the control of the one or more processors 184 by the one or more processors executing computer instruction code stored in the memory 182 as, for example, a software routine. When the computer instruction code is executed by the one or more processors 184, the one or more processors 184 controls the chamber 100 to perform processes in accordance with the various methods.

The controller 180 may perform artificial intelligence or machine learning techniques to automatically identify and complete one or more tasks on behalf of the user such as identifying the appropriate look-up temperature model or modifying the model as needed.

The chamber 100 also includes a radiation source 150 disposed opposite at least one of the one or more detectors 137. The radiation source 150 is generally a pulsed radiation source, examples of which are described below.

As shown in FIG. 1, in one example, the chamber 100 optionally includes a beam splitter 141 in optical communication with the radiation emitted by the pulsed radiation source 150. In operation, the beam splitter 141 directs radiation from the pulsed radiation source 150 to a sampling detector 139, which is used to detect source modulation directly from the pulsed radiation source 150. The sampling detector 139 can help to compensate for any pulse-to-pulse modulation or other amplitude modulation. The beam splitter 141 typically has a low reflectance ratio, for example less than or equal to about 30%, such as about 20%, to avoid over-attenuating the radiation from the radiation source 150. In one example, the beam splitter 141 is a fiber coupled splitter, which is connected to the sampling detector 139 through a fiber. In FIG. 1, the beam splitter 141 is shown outside of the chamber body 120; however, the beam splitter 141 may also be positioned inside of the chamber 100 and not fiber-coupled to the radiation source 150, for example, inside the processing region, to detect the radiation emitted from the radiation source 150.

As illustrated, the radiation source 150 is coupled to the chamber body 120. For clarity, the radiation source 150 is shown as being located outside of the chamber body 120; however, it is also contemplated that the radiation source 150 may be located inside the chamber body 120. In one example, the radiation source 150 comprises a plurality of mounts coupled to or mounted directly on the lamp assembly 110. In other examples, the radiation source 150 is located inside of the lamp assembly 110, attached to the lamp assembly 110, immediately outside of the lamp assembly 110, or positioned at another suitable location. The radiation source 150 generates radiation for input to the beam splitter 141. The radiation emitted by the radiation source 150 generally travels through the beam splitter 141 to an incident area of a receiving surface of the substrate (not shown) positioned on the substrate support 130 in the chamber 100.

The radiation source 150 may include two pulsed lasers, a first laser 162a and a second laser 162b. In one example, the first laser 162a emits pulses of radiation in bands centered at a first wavelength, for example, 1,030 nanometers (nm). The second laser 162b emits pulses of radiation in bands centered at a second wavelength, for example, at 1,080 nm. The two pulsed lasers 162a and 162b may be generally high-powered lasers emitting at various wavelengths used from transmission pyrometry. Alternatively, the radiation source 150 may also include two or more light emitting diodes (LEDs), such as superluminescent diodes (SLEDs or SLDs). SLEDs are similar to lasers, but do not include front and back mirrors. Alternatively, the radiation source 150 may include a single pulsed laser (e.g., laser 262 as shown in FIG. 2B) that emits pulses at the first wavelength and the second wavelength.

Figure 2A:
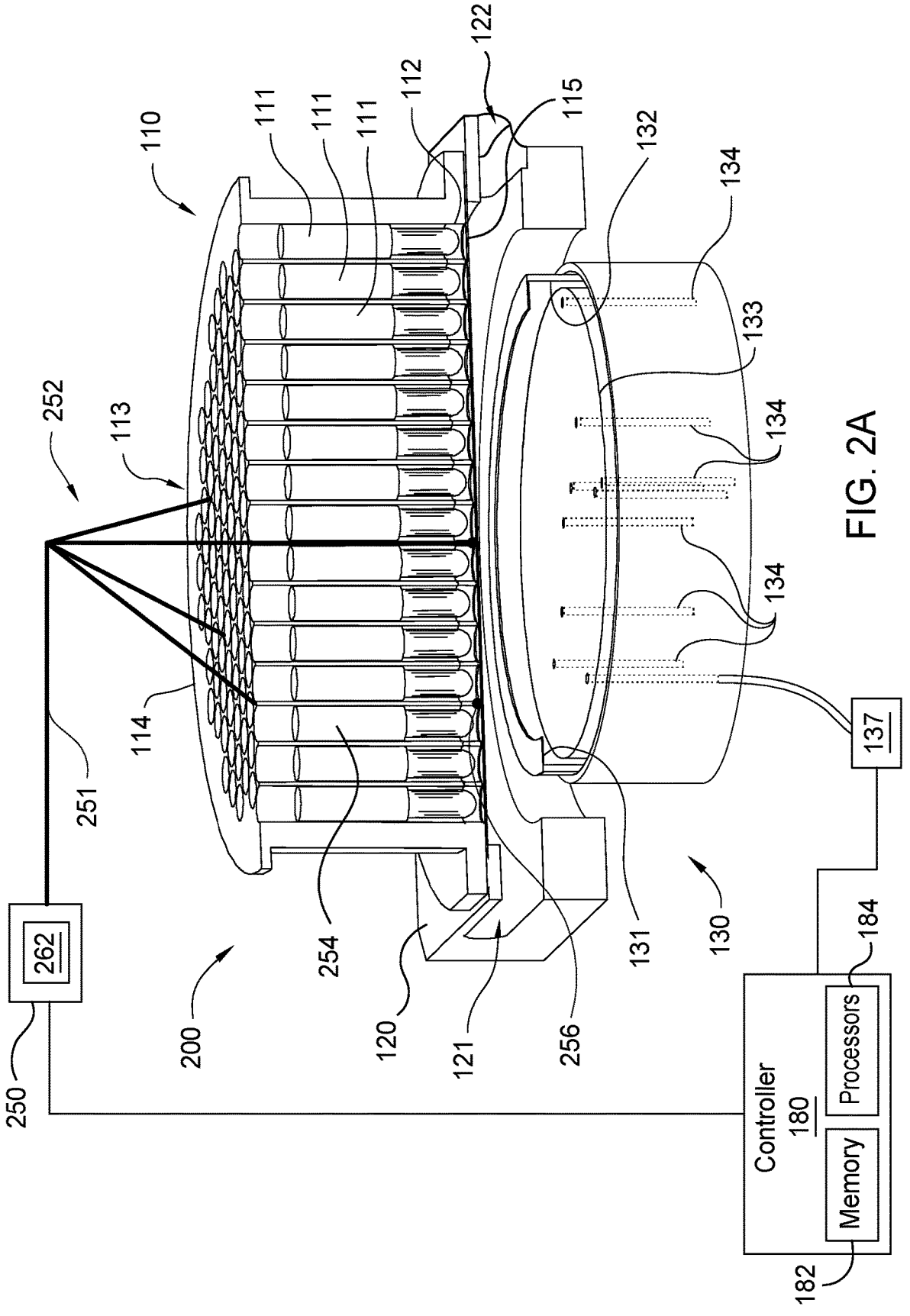
FIG. 2A is a partial schematic diagram of an RTP chamber having a radiation source including one laser according to one exemplary embodiment of the present disclosure.

FIG. 2A is a partial schematic diagram of an RTP chamber 200 according to one example of the present disclosure. The chamber 200 is similar to the chamber 100; however, the chamber 200 includes a pulsed laser radiation source 250 and a source manifold 252. The chamber 200 generally includes a lamp assembly 110, a chamber body 120, and a substrate support assembly 130.

Figure 2B:
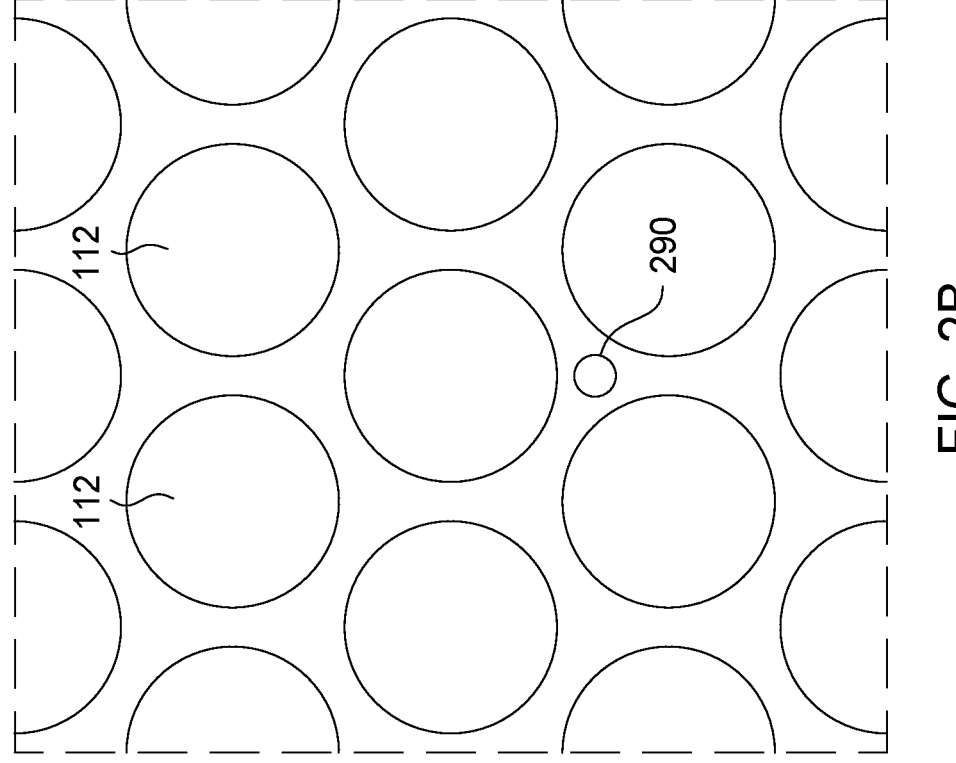
FIG. 2B is a top down view of a portion of the honeycomb array inside the lamp housing of the RTP chamber of FIG. 2A.

In one example, the source manifold 252 includes a plurality of beam guides 254, or optical fibers, disposed through openings 290 through interstitial spaces between the lamps 111 in the lamp assembly 110, as shown in FIG. 2B. As discussed above, the lamps 111 positioned inside the tubes 112 form a honeycomb array 113. The honeycomb array 113 configuration allows for the lamps 111 positioned inside the tubes 112 to be more tightly packed and closer together. The lamps 111 inside the tubes 112 run vertically or perpendicular to the upper surface of the water-cooled housing 114. Vertical interstitial spaces are formed within the honeycomb array 113 between the tubes 112. The openings 290 are drilled in the upper surface of the water-cooled housing 114 and run vertically through the interstitial spaces parallel to the tubes 112 having the lamps 111 therein. In one example, the openings 290 run further vertically through the window 115. A diameter of each of the openings 290 is greater than or equal to the diameter of each of the plurality of beam guides 254 such that the beam guides 254 may pass through the openings 290 to emit radiation to an incident surface of the substrate. In a further example, each of the plurality of beam guides 254 includes a collimating end surface or lens 256. The collimating end surface or lens 256 generally directs the radiation onto an incident area of the receiving surface of the substrate.

The radiation source 250 may include a single pulsed laser 262. The pulsed laser 262 is generally a high-powered laser emitting at various wavelengths used from transmission pyrometry. Alternatively, the radiation source 250 may include a single LED, such as a SLED. Alternatively, the radiation source 250 may include a plurality of pulsed lasers (e.g., lasers 162a, 162b from FIG. 2A) which emit pulses at the same wavelength.

As shown in FIG. 2A, the radiation source 250 includes the single laser 262. In one example, the single laser 262 emits pulses of radiation in bands centered at a single wavelength, such as at 1,030 nanometers nm or 1,080 nm for a silicon substrate. The pulses emitted from the laser 262 is generally coupled into at least one fiber 251, which passes the pulses into the source manifold, or splitter, such as a 2×4 splitter, which splits the pulses into the plurality of beam guides, or optical fibers, 254, each of which culminates with one of the collimating end surfaces or lenses 256 at a distal (from the single fiber 251) end thereof. The at least one fiber 251 couples the radiation source 250 to the plurality of beam guides 254. In an example in which the pulses from the laser 262 are split among four beam guides, or optical fibers, 254, losses from optics total about 60%, so each fiber outputs about 10% of the total nominal output of the laser, in pulses at the respective wavelength bands of the laser 262.

The chamber 200 also includes one or more photo probes 134 aligned to the one or more beam guides, or optical fibers, 254 to detect radiation transmitted from the radiation source 250. The chamber 200 also includes one or more detectors 137 optically coupled to the radiation source 250 and disposed opposite from the radiation source across the processing plane, which is generally any suitable detector for measuring radiation as a function of direction or wavelength. In addition to the one or more detectors 137, or alternatively, in some examples, the chamber 200 includes an indium gallium arsenide (InGaAs) Spectrometer or an InGaAs linear array with Near Infrared (NIR) Transmission grating for detection power as a function of wavelength at higher powers, for example, powers higher than about 1100 nm.

Further examples of the radiation source 150 and the radiation source 250 include, but are not limited to, any solid state pulsed sources, chopped incandescent sources, halogen incandescent sources, and discharge lamps, which emit pulses of radiation at various frequencies.

The radiation source 150 and the radiation source 250 are discussed separately above; however, the present disclosure also contemplates any combination of the variety of radiation sources, including lasers, LEDs, and broadband sources for transmission pyrometry to measure and graph low to high temperatures.

Figure 3:
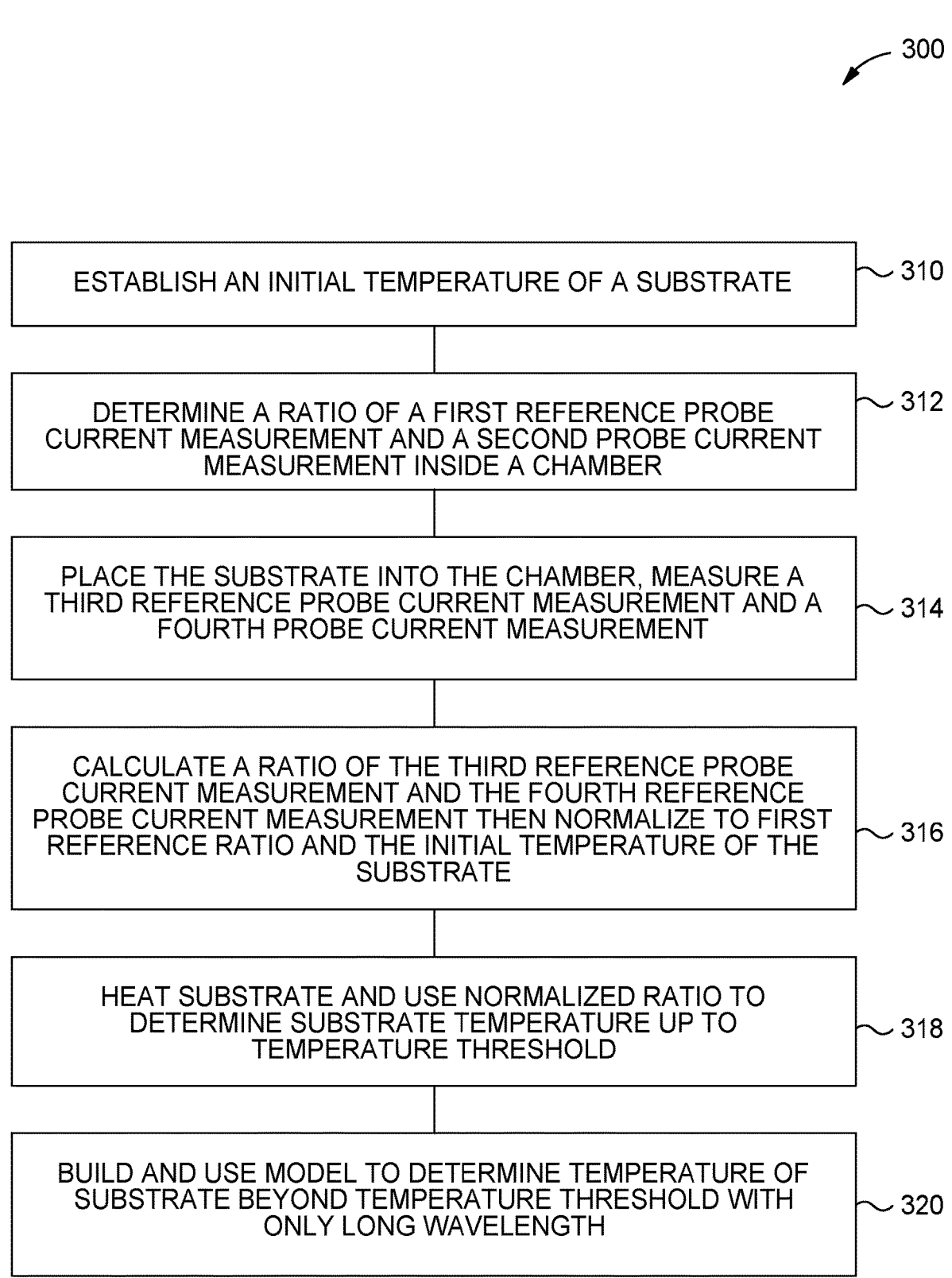
FIG. 3 illustrates a flow diagram of a dual wavelength temperature measurement method according to one exemplary embodiment of the present disclosure.

FIG. 3 illustrates a flow diagram of a dual wavelength temperature measurement method 300 according to the examples of the present disclosure. The method 300 begins at operation 310 by establishing an initial temperature of a substrate prior to inserting the substrate into a chamber. Establishing the initial temperature of the substrate may include taking an initial temperature of the substrate using a measuring device, such as one or more of contact measurement PT100 sensors or thermocouples. Alternatively, establishing the initial temperature of the substrate may include assuming the substrate is at thermal equilibrium with room temperature.

In operation 312, a first reference probe current measurement corresponding to a first wavelength emitted from a first radiation source (e.g., the first laser 162*a*) and a second reference probe current measurement corresponding to a second wavelength emitted from a second radiation source (e.g., the second laser 162*b*) are measured using at least one detector (e.g., the one or more detectors 137) in which the second wavelength (e.g., 1,080 nm) is greater than the first wavelength (e.g., 1,030 nm). The reference probe current measurements can be used to correct for matrix effects, dynamic system properties and background light, for example, as would be understood by those skilled in the art. A ratio of the first reference probe current measurement to the second probe current measurement is calculated (i.e., first reference ratio).

In operation 314, the substrate is placed into the chamber (e.g., chamber 100) in a position on a substrate support (e.g., the substrate support 130) between the first and second radiation sources and the one or more detectors (e.g., the one or more detectors 137). A third reference probe current measurement corresponding to the first wavelength emitted from the first radiation source through the substrate and a fourth probe current measurement corresponding to the second wavelength emitted from the second radiation source through the substrate are measured. The substrate support (e.g., the substrate support 130) may then be actuated to rotate the substrate. The first and second wavelengths are transmitted from the at least one radiation source (e.g., the first and second radiation source) and received by detectors (e.g., the one or more detectors 137) at on/off duty cycles that are synchronized with the rotation of the substrate.

Alternatively, the substrate may be a patterned substrate that is placed onto the substrate support and rotated. For a patterned substrate, full rotational data is needed to establish the reference ratio and the ratio of the probe current measurement. As the substrate rotates, the probe current measurements from the one or more discrete wavelengths (e.g., the first and second wavelengths) emitted through the patterned substrate are measured and categorized as either active signals or background signals. Active signals are probe current measurements emitted through at least one of the patterned portion of the substrate and background signals are probe current measurements emitted through at least one non patterned portion of the patterned substrate. The reference probe current measurements of the one or more discrete wavelengths (e.g., the first and second wavelengths) are calculated by subtracting the average through at least one full rotation of the background signals from the average through at least one full rotation of the active signals In operation 316, a ratio of the third reference probe current measurement and the fourth reference probe current measurement is calculated (i.e., second reference ratio). The second reference ratio is then normalized to the first reference ratio and the initial temperature of the substrate, i.e., corrected for matrix effects, dynamic system properties, and background light, for example.

In operation 318, a model is built by using the normalized second reference ratio and the initial temperature measurement to determine an appropriate temperature look-up table. The substrate is heated by a heat source (e.g., by lamps 111) and the temperature of the substrate is determined using a ratio of the probe current measurement of the first wavelength to the probe current measurement of the second wavelength and the initial temperature measurement as input to the selected temperature look-up table to determine the substrate temperature up to a temperature threshold, preferably about 80° C. The substrate support may be actuated to rotate the substrate at the same on/off duty cycles used in operation 314.

In operation 320, the temperature look-up table model from operation 318 is used with only the received probe current measurements corresponding to the second wavelength as input to determine the substrate temperature beyond 80° C. This model allows the temperature of the substrate to be monitored during substrate processing using only one wavelength, preferably the longest wavelength of the one or more discrete wavelengths used (e.g., 1,020 nm to 1,090 nm). Using only one wavelength eliminates the need to continuously switch between different wavelengths and simplifies temperature measurement of the substrate during processing, which ultimately reduces costs. This model is also not restricted to silicon substrates and can be tailored for other semiconductor substrates such as gallium arsenide (GaAs) or gallium nitride (GaN).

FIG. 4 illustrates a flow diagram of a single wavelength temperature measurement method 400 according to the examples of the present disclosure. The method 400 begins at operation 410 by establishing an initial temperature of a substrate prior to insertion into a chamber (e.g., the chamber 200). The initial temperature may be established by taking measurements using a temperature-measuring device such as one or more of contact measurement PT100 sensors or thermocouples. Alternatively, the initial temperature may be established by assuming the substrate is at thermal equilibrium with room temperature.

At operation 412, a first reference probe current measurement corresponding to a single wavelength (e.g., 1,020 nm to 1,090 nm for a silicon substrate) emitted from a single radiation source (e.g., the laser 162) is measured using the one or more detectors (e.g., the one or more detectors 137) prior to insertion of the substrate into the chamber (e.g., the chamber 200).

In operation 414, the substrate is placed into the chamber (e.g., the chamber 200) in a position on a substrate support (e.g., the substrate support 130) between the single radiation source (e.g., the laser 162) and the one or more detectors (e.g., the one or more detectors 137). A second reference probe current measurement corresponding to the single wavelength emitted from the single radiation source through the substrate is measured.

In operation 416, the second reference probe current measurement and initial temperature measurement from 410 are used to determine a doping of the substrate. With the initial temperature and radiation intensity through the substrate known via the one or more detectors 137, an emissivity of the substrate may be calculated. When the emissivity is determined, it is possible to determine the dopant concentration in the substrate. Calculating the emissivity and determining the doping of the substrates alleviates the need for emissivity values of the substrate to be known by an operator or assumed to be unity, resulting in more accurate emissivity values improving performance.

In operation 418, a model for temperature measurement based on a look-up temperature table is built using the doping of the substrate as input to determine the temperature of the substrate based on the probe current measurement of the single wavelength received by the one or more detectors.

In operation 420, the substrate is heated (e.g., by lamps 111) and the single radiation source emits the single wavelength periodically. The one or more detectors (e.g., the one or more detectors 137) receive probe current measurements from the single wavelength. The probe current measurements are then used by the model to determine the current substrate temperature. This model allows the temperature of the substrate to be monitored during substrate processing using only one wavelength.

Figure 5:
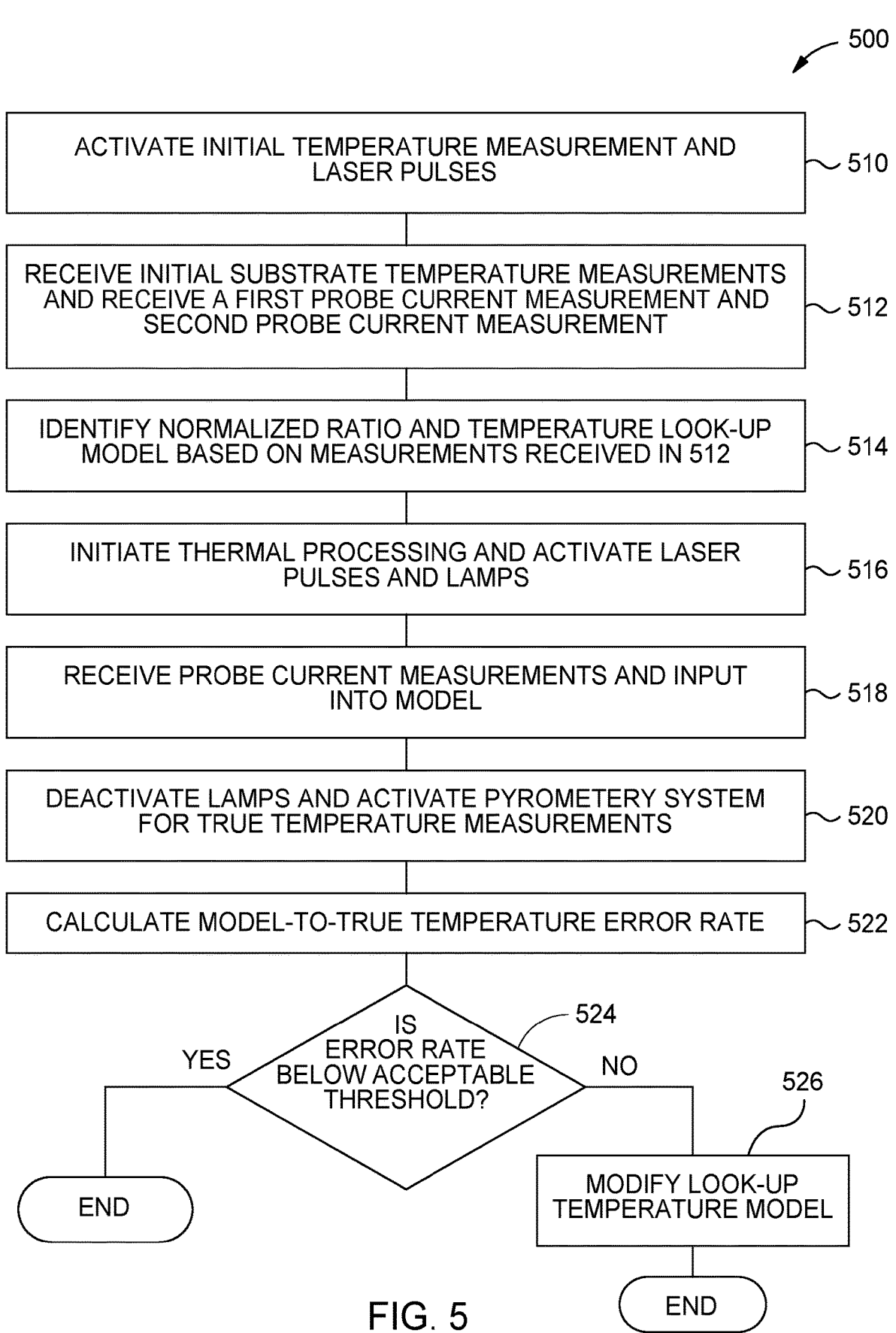
FIG. 5 is a flowchart illustrating example operations performed by one or more processors in a controller of an RTP chamber according to one or more exemplary embodiments of the present disclosure.

FIG. 5 is flowchart illustrating exemplary operations performed by a system controller (e.g., the controller 180) in accordance with one or more aspects of the present disclosure. FIG. 5 is described below in the context of the RTP chamber 100 of FIG. 1. For example, the controller 180, while executing instructions from the memory 182 at the one or more processors 184 of the controller 180, may perform one or more of operations 510-524 in accordance with one or more aspects of the present disclosure.

In operation 510, the controller 180 may activate an initial temperature measurement device, such as a contact measurement PT100 or thermocouple, and the radiation source 150.

In operation 512, in response to the activation, the controller 180 may receive initial substrate temperature measurements from the initial temperature measurement device and may receive a first initial probe current measurement from the one or more detectors 137 of the first wavelength of the first laser 162a and a second initial probe current measurement from the one or more detectors 137 of the second wavelength of the second laser 162b.

In operation 514, the controller 180 may identify a normalized ratio between the first initial probe current measurement, the second initial probe current measurement, and the initial substrate temperature. The controller 180 may then identify, based on the normalized ratio, a temperature look-up model.

In operation 516, in response to identifying the normalized ratio and appropriate look-up temperature model, the controller 180 may then initiate thermal processing by causing the lamps 111 to switch to an ON state.

In operation 518, the controller 180 may then cause the first laser 162a and second laser 162b to emit pulses of radiation at their respective wavelengths through the substrate. The one or more detectors 137 receive the pulses of radiation and determine the probe currents based on the received pulses of radiation. The controller 180, based on the received probe currents, determines the temperature of the substrate using the normalized ratio until the temperature of the substrate measures above a temperature threshold. In response, the controller 180 may deactivate the first laser 162a and further determine the temperature of the substrate using the temperature look-up model with the received probe current data from only the second laser 162b as input.

In operation 520, the controller 180 may then cause the lamps 111 to switch to an OFF state. In response to the lamps 111 switching to an OFF state, the controller 180 may cause the one or more detectors 137 to receive true temperature measurements from the substrate while causing the one or more detectors to continue to receive probe current data to use as input into the selected temperature look-up model to continue to determine the temperature of the substrate as model measurements. As the lamps 111 are switched OFF, the thermal noise is effectively removed. By continuing to monitor the substrate temperature using a ratio of the received probe currents to the initial temperature similar to operation 510, the recorded temperature may be considered the "true" temperature of the substrate.

In operation 522, in response to receiving the true temperature measurements and the model measurements, the controller 180 may calculate a rate of error between the model measurements and the true temperature measurements.

In operation 524, the controller 180 may, based on the rate of error, modify the look-up temperature model.

Figure 6:
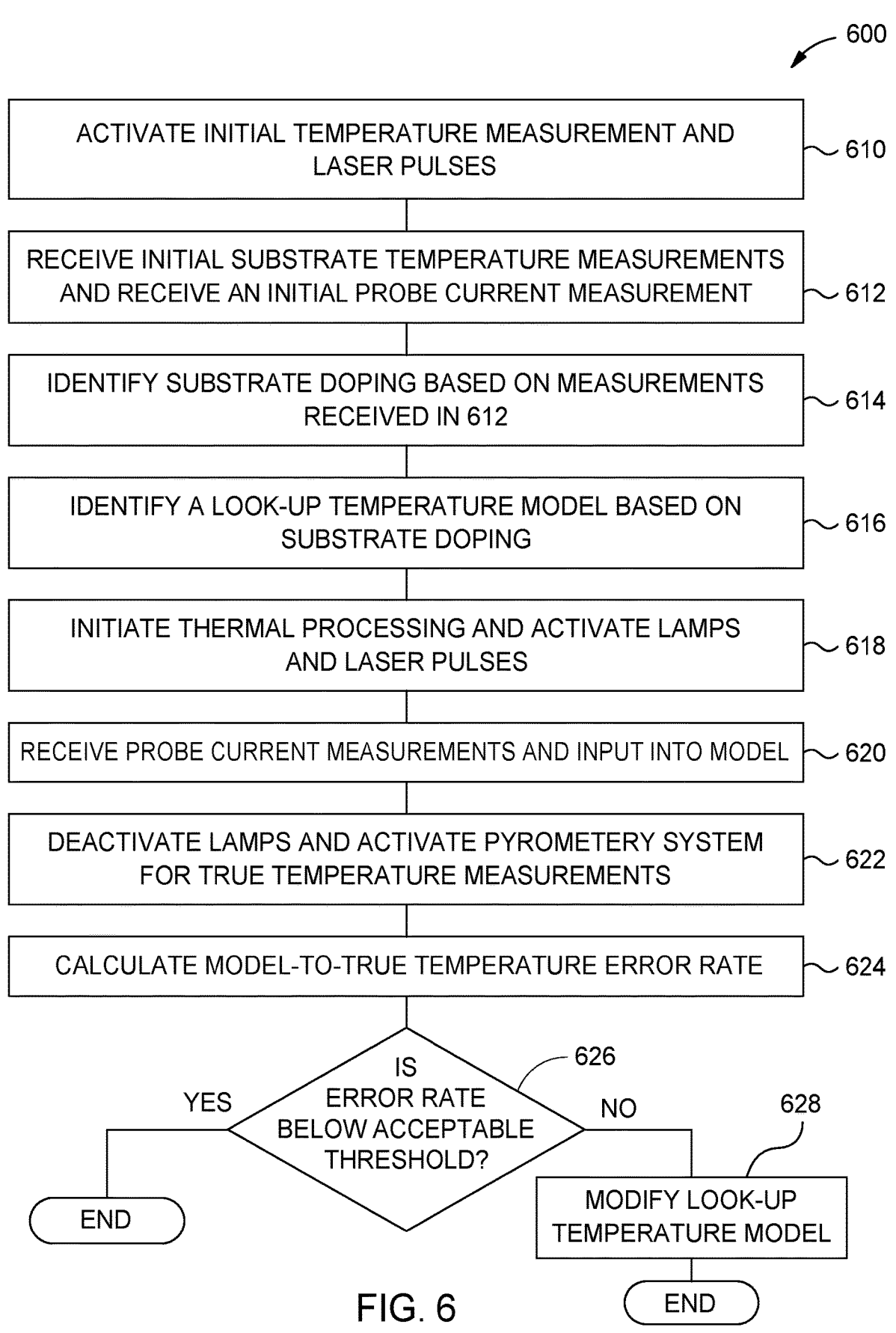
FIG. 6 is a flowchart illustrating example operations performed by one or more processors in a controller of an RTP chamber according to one or more exemplary embodiments of the present disclosure.

FIG. 6 is a flowchart illustrating another example of operations performed by the controller 180 in accordance with one or more aspects of the present disclosure. FIG. 6 is described below in the context of the RTP chamber 200 of FIG. 2. For example, the controller 180, while executing at one or more processors 184 of the computing device may perform one or more of operations 610-624 in accordance with one or more aspects of the present disclosure.

In operation 610, the controller 180 may activate the initial temperature measurement device and the radiation source 250 using the laser 162.

In operation 612, in response to the activation, the controller 180 may receive an initial substrate temperature measurement from the initial temperature measurement device and may receive an initial probe current measurement from the one or more detectors 137 of the wavelength emitted by the laser 162.

In operation 614, the controller 180 may, in response to receiving the initial probe current measurement and the initial temperature measurement, identify a substrate doping of the substrate based on the initial probe current measurement the initial substrate temperature measurement. The controller 180 may then, in operation 616, identify, based on the substrate doping measurement, a temperature look-up model, for example in the memory 182.

In operation 618, in response to identifying the look-up temperature model, the controller 180 may then initiate thermal processing by causing lamps 111 to switch to an ON state. The controller 180 may then cause the laser to emit pulses of radiation at the single wavelength through the substrate. The one or more detectors 137 receive the pulses of radiation and determine the probe currents based on the received pulses of radiation.

In operation 620, the controller 180, receives the probe currents, and based on the received probe currents, determines the temperature of the substrate using the temperature look-up model with the received probe current data as input.

In operation 622, the controller 180 may then cause the lamps 111 to switch to an OFF state. In response to the lamps switching to an OFF state, the controller 180 may cause the one or more detectors 137 to receive true temperature measurements from the substrate while causing the one or more detectors to continue to receive probe current data to use as input into the selected temperature look-up model to continue to determine the temperature of the substrate as model measurements.

In operation 624, in response to receiving the true temperature measurements and the model measurements, the controller 180 may calculate a rate of error between the model measurements and the true temperature measurements.

In operation 626, the controller 180 may, based on the rate of error, modify the look-up temperature model.

With multiple radiation sources, a mixture of full-on/full-off and amplitude modulation can be used. The pulsing of the one or more of the radiation sources 150 or 250 can be synchronized with wafer rotation to read from the same position on the substrate, or various patterns of pulsing can be used to obtain readings from various positions on the substrate. In one example, the pulsing frequency is selected to enhance discrimination from radiation transmitted by a heating source.

In some examples using pulsed radiation sources, the radiation emitted from the plurality of lamps can have wavelengths from about 1,020 nm to about 1,090 nm, which can be thermal noise or background noise to the radiation emitted from the one or more radiation sources when detected by one or more detectors, particularly if the radiation emitted is between 1,020 nm and 1,090 nm as would be the case for processing a silicon substrate. The background noise is measured while the laser or other pulsed radiation source is off. The background noise is subtracted from the detected radiation when the laser is on to get a true transmission signal. To improve on the accuracy of the measurement of the substrate from low to high temperatures, the one or more detectors records radiation when the one or more radiation sources is on and when the one or more radiation sources is off. The signal obtained by the one or more detectors when the one or more radiation sources is off is subtracted from the signal obtained by the one or more detectors when the one or more radiation sources is on, and the resulting signal (i.e., temperature) is a more accurate measurement of the temperature of the substrate. Because the radiation from the one or more radiation sources is pulsed, the background radiation can be recorded and subtracted from the measurement when the one or more radiation sources are on.

In another example, background noise in the chamber is reduced or eliminated using an integral transform technique, such as Fast Fourier Transform (FFT), to remove frequency contributions associated with noise. Types of noise that may be eliminated include, but are not limited to, photonic noise, electronic noise, or electromagnetic noise.

Benefits of the present disclosure include temperature measurement along a broad range of temperatures from low to high. Once measured, the temperatures are generally graphed to illustrate the temperature on the substrate surface over time, which is beneficial to substrate manufacturing processes. Benefits of the present disclosure include temperature measurement using a single wavelength during processing which reduces or eliminates the need to switch continuously between different wavelengths leading to lower costs and easier thermal processing. Additionally, the present disclosure is not limited to silicon-based substrates and can be applied to substrates comprising other semiconductor materials such as gallium arsenide (GaAs) or gallium nitride (GaN).

While the foregoing is directed to examples of the present disclosure, other and further examples of the disclosure may be devised without departing from the basic scope thereof, and the scope thereof is determined by the claims that follow.

What is claimed is:

1. A method of temperature measurement of a substrate, comprising:

determining, prior to processing a substrate in a chamber, an initial substrate temperature;

transmitting a first plurality of pulses at a first wavelength from a first radiation source through a first surface of the substrate prior to processing the substrate;

transmitting a second plurality of pulses at a second wavelength from a second radiation source through the first surface of the substrate prior to processing the substrate, wherein the second wavelength is greater than the first wavelength;

receiving the first plurality of pulses and the second plurality of pulses using at least one detector facing a second surface of the substrate that is opposing the first surface prior to processing the substrate;

determining, prior to processing the substrate, a reference probe current ratio, wherein the reference probe current ratio is a ratio of a first initial probe current measurement corresponding to the first plurality of pulses and a second initial probe current measurement corresponding to the second plurality of pulses received by the at least one detector;

building a model using the initial substrate temperature and the reference probe current ratio prior to processing the substrate;

processing the substrate by heating the substrate with one or more heat sources;

transmitting a third plurality of pulses at the first wavelength from the first radiation source and transmitting a fourth plurality of pulses at the second wavelength from the second radiation source through the first surface of the substrate while processing the substrate;

receiving one or more probe current measurements corresponding to the first wavelength and one or more probe current measurements corresponding to the second wavelength using the at least one detector while processing the substrate; and using the model to determine an instant temperature of the substrate while processing the substrate using the one or more probe current measurements corresponding to the second wavelength.

2. The method of claim 1, wherein using the model comprises:

using a normalized ratio between the reference probe current ratio and the initial substrate temperature to determine the instant temperature of the substrate until the instant temperature reaches a predetermined temperature threshold; and using a look-up temperature model after the instant temperature of the substrate exceeds the predetermined temperature threshold to further determine the instant temperature beyond the predetermined temperature threshold, wherein only the probe current measurements corresponding to the second wavelength are used as input.

3. The method of claim 1, wherein the one or more heat sources comprise at least one lamp.

4. The method of claim 1, wherein the initial substrate temperature is measured using a thermocouple.

5. The method of claim 1, wherein the one or more detectors comprises at least one pyrometer.

6. The method of claim 1, further comprising placing the substrate onto a substrate support within the chamber and actuating the substrate support such that the substrate rotates while processing the substrate.

7. A method of temperature measurement of a substrate, comprising:

determining, prior to processing a substrate in a chamber, an initial substrate temperature;

transmitting a first plurality of pulses at a single wavelength from a single radiation source through a first surface of the substrate prior to processing the substrate;

receiving the first plurality of pulses using at least one detector facing a second surface of the substrate that is opposing the first surface prior to processing the substrate;

determining, prior to processing the substrate in a chamber, an initial probe current measurement corresponding to the first plurality of pulses received by the at least one detector prior to processing the substrate;

building a model using the initial substrate temperature and the initial probe current measurement;

processing the substrate by heating the substrate with one or more heat sources;

transmitting a second plurality of pulses at the single wavelength from the single radiation source through the first surface of the substrate while processing the substrate;

receiving the second plurality of pulses using the at least one detector to produce a plurality of probe current measurements while processing the substrate; and using the model and at least one of the plurality of probe current measurements to determine an instant temperature of the substrate while processing the substrate.

8. The method of claim 7, wherein using the model comprises:

using the initial substrate temperature and the initial probe current measurement to determine a doping of the substrate;

using the doping of the substrate to determine a look-up temperature model; and using the look-up temperature model to determine the instant temperature of the substrate wherein the plurality of probe current measurements corresponding to the single wavelength are used as input.

9. The method of claim 7, wherein the initial substrate temperature is measured using a thermocouple.

10. The method of claim 7, wherein the at least one detector comprises a pyrometer.

11. The method of claim 7, wherein the substrate is a patterned substrate.

12. The method of claim 7, further comprising using the model to determine the temperature measurement of the substrate during processing by inputting the plurality probe current measurements of the single wavelength into the model.

13. The method of claim 7, further comprising placing the substrate onto a substrate support within the chamber and actuating the substrate support such that the substrate rotates while processing the substrate.

14. A processing system comprising:

a chamber;

a substrate support disposed in the chamber;

a plurality of heat sources disposed in the chamber;

one or more radiation sources coupled to the chamber;

one or more detection devices coupled to the chamber;

and a controller coupled to the chamber and configured to cause the system to perform a method for measuring a temperature of a substrate disposed on the substrate support, the method comprising:

transmitting a first plurality of pulses at a single wavelength from the one or more radiation sources through a first surface of the substrate prior to processing the substrate;

receiving the first plurality of pulses using the one or more detection devices facing a second surface of the substrate that is opposing the first surface prior to processing the substrate;

determining, prior to processing the substrate, an initial probe current measurement corresponding to the first plurality of pulses received by the one or more detection devices prior to processing the substrate;

building a model using an initial substrate temperature and the initial probe current measurement;

processing the substrate by heating the substrate with the plurality of heat sources;

transmitting a second plurality of pulses at the single wavelength from the single radiation source through the first surface of the substrate while processing the substrate;

receiving the second plurality of pulses using the one or more detection devices to produce a plurality of probe current measurements while processing the substrate; and using the model and at least one of the plurality of probe current measurements to determine an instant temperature of the substrate while processing the substrate.

15. The system of claim 14, wherein the using the model comprises:

using the initial substrate temperature and the initial probe current measurement to determine a doping of the substrate;

using the doping of the substrate to determine a look-up temperature model; and using the look-up temperature model to determine the instant temperature of the substrate using the plurality of probe current measurements corresponding to the single wavelength as input.

16. The system of claim 15, wherein the one or more heat sources comprise at least one lamp.

17. The system of claim 15, wherein the substrate is a patterned substrate and comprises a patterned portion and a non-patterned portion.

18. The system of claim 17, wherein the method further comprises:

transmitting the plurality of first pulses through the patterned portion and non-patterned portion such that the initial probe current measurement comprises a plurality of first active signals corresponding to the patterned portion and a plurality of first background signals corresponding to the non-patterned portion; and transmitting the plurality of second pulses through the patterned portion and non-patterned portion such that the plurality of second probe current measurements comprise a plurality of second active signals corresponding to the patterned portion and a plurality of second background signals corresponding to the non-patterned portion.

19. The system of claim 18, wherein the method further comprises determining an average of the plurality of first active signals and an average of the plurality of first background signals then subtracting the average of the plurality of first background signals from the average of the plurality of first active signals to determine the initial probe current measurement.

20. The system of claim 19, wherein the method further comprises determining an average of the plurality of second active signals and an average of the plurality of second background signals then subtracting the average of the plurality of second background signals from the average of the plurality of second active signals.

* * * * *